(12) United States Patent
Ma et al.

(10) Patent No.: US 10,978,493 B2
(45) Date of Patent: Apr. 13, 2021

(54) DISPLAY SUBSTRATE AND MANUFACTURING METHOD THEREOF, AND DISPLAY DEVICE

(71) Applicants: BOE TECHNOLOGY GROUP CO., LTD., Beijing (CN); HEFEI BOE OPTOELECTRONICS TECHNOLOGY CO., LTD., Anhui (CN)

(72) Inventors: Juncai Ma, Beijing (CN); Jie Yang, Beijing (CN)

(73) Assignees: BOE TECHNOLOGY GROUP CO., LTD., Beijing (CN); HEFEI BOE OPTOELECTRONICS TECHNOLOGY CO., LTD., Anhui (CN)

( * ) Notice: Subject to any disclaimer, the term of this patent is extended or adjusted under 35 U.S.C. 154(b) by 0 days.

(21) Appl. No.: 15/133,585

(22) Filed: Apr. 20, 2016

(65) Prior Publication Data

US 2016/0379996 A1    Dec. 29, 2016

(30) Foreign Application Priority Data

Jun. 29, 2015 (CN) .......................... 201510374977.4

(51) Int. Cl.
*H01L 27/12* (2006.01)
*G09G 3/36* (2006.01)
(Continued)

(52) U.S. Cl.
CPC ........ *H01L 27/124* (2013.01); *H01L 27/1259* (2013.01); *G02F 2001/13332* (2013.01);
(Continued)

(58) Field of Classification Search
None
See application file for complete search history.

(56) References Cited

U.S. PATENT DOCUMENTS

| 6,862,008 B2 * | 3/2005 | Yamazaki | G02F 1/13454 345/62 |
| 7,573,469 B2 * | 8/2009 | Yamazaki | G02F 1/13454 345/204 |

(Continued)

FOREIGN PATENT DOCUMENTS

| CN | 1773572 A | 5/2006 |
| CN | 102403320 A | 4/2012 |

(Continued)

OTHER PUBLICATIONS

First Office Action dated Jun. 1, 2017 in corresponding Chinese Patent Application No. 201510374977.4.

(Continued)

*Primary Examiner* — Abul Kalam
(74) *Attorney, Agent, or Firm* — Nath, Goldberg & Meyer; Joshua B. Goldberg (57) ABSTRACT

The present invention provides a display substrate and a manufacturing method thereof, and a display device. The display substrate comprises a base substrate, and gate lines, data lines, a gate driving circuit and a source driving circuit on the base substrate, the gate lines and the data lines define pixel units, the pixel unit comprises a thin film transistor and a pixel electrode, the data lines are connected to the source driving circuit, the display substrate further comprising gate line connection wires on the base substrate, the gate lines are connected to the gate driving circuit through the gate line connection wires, the gate driving circuit and the source driving circuit are located at edge positions on the base substrate in an extending direction of the data lines, and they are opposite to each other. The widths of the bezel in the extending direction of the gate lines are reduced.

18 Claims, 9 Drawing Sheets

(51) Int. Cl.
  *G02F 1/1333* (2006.01)
  *G02F 1/1345* (2006.01)
(52) U.S. Cl.
  CPC . *G02F 2001/13456* (2013.01); *G09G 3/3677* (2013.01); *G09G 2300/0408* (2013.01); *G09G 2300/0426* (2013.01); *G09G 2310/0264* (2013.01)

(56) References Cited

U.S. PATENT DOCUMENTS

| | | | | |
|---|---|---|---|---|
| 9,105,594 | B2* | 8/2015 | Yamazaki | G02F 1/13454 |
| 2003/0030381 | A1* | 2/2003 | Yamazaki | G02F 1/13454 |
| | | | | 315/169.1 |
| 2013/0093657 | A1* | 4/2013 | Song | G09G 3/3648 |
| | | | | 345/92 |
| 2013/0113766 | A1* | 5/2013 | Kim | G09G 3/3648 |
| | | | | 345/205 |
| 2014/0043306 | A1 | 2/2014 | Min et al. | |
| 2014/0168553 | A1* | 6/2014 | Park | G02F 1/134363 |
| | | | | 349/43 |
| 2014/0319527 | A1* | 10/2014 | Shin | H01L 27/124 |
| | | | | 257/59 |
| 2016/0358534 | A1 | 12/2016 | Kim | |

FOREIGN PATENT DOCUMENTS

| | | |
|---|---|---|
| CN | 104133331 A | 11/2014 |
| CN | 104464603 A | 3/2015 |

OTHER PUBLICATIONS

The Second Office Action dated Sep. 12, 2017 corresponding to Chinese application No. 201510374977.4.
The Third Office Action dated Feb. 6, 2018 corresponding Chinese application No. 201510374977.4.

* cited by examiner

DISPLAY SUBSTRATE AND MANUFACTURING METHOD THEREOF, AND DISPLAY DEVICE

FIELD OF THE INVENTION

The present invention relates to the field of display technology, and particularly to a display substrate and a manufacturing method thereof, and a display device.

BACKGROUND OF THE INVENTION

As the development of the display technology, liquid crystal displays (LCDs) are applied more and more widely. A liquid crystal display may comprise an array substrate and a color filter substrate which are provided oppositely to form a cell, and liquid crystal is provided between the array substrate and the color filter substrate. The array substrate is provided with a source driving circuit and a gate driving circuit thereon, both the source driving circuit and the gate driving circuit are located at edge positions of the array substrate, the source driving circuit is provided at an edge position in an extending direction of data lines and the gate driving circuit is provided at an edge position in an extending direction of gate lines. For example, in a case that the source driving circuit is provided at an upper edge of the array substrate, the gate driving circuit is provided at a left or right edge of the array substrate.

Since the gate driving circuit is provided at an edge position in an extending direction of gate lines, it is difficult for the liquid crystal display to realize narrow bezel in the extending direction of the gate lines.

SUMMARY OF THE INVENTION

The present invention provides a display substrate and a manufacturing method thereof, and a display device, which can realize narrow bezel in the extending direction of gate lines for the display device.

To achieve the above object, the present invention provides a display substrate, comprising a base substrate, and gate lines, data lines, a gate driving circuit and a source driving circuit on the base substrate, wherein the gate lines and the data lines define pixel units, the pixel unit comprises a thin film transistor and a pixel electrode connected with the thin film transistor, and the data lines are connected to the source driving circuit, the display substrate further comprising gate line connection wires on the base substrate, wherein the gate lines are connected to the gate driving circuit through the gate line connection wires, and both the gate driving circuit and the source driving circuit are located at edge positions on the base substrate in an extending direction of the data lines, and the gate driving circuit is located on the opposite side to the source driving circuit.

Preferably, the gate line connection wire is at least partially overlapped with the data line.

Preferably, a straight section of the gate line connection wire is overlapped with the data line.

Preferably, the gate line connection wires are parallel to the data lines.

Preferably, the gate line connection wire is located directly below the data line; or the gate line connection wire is located directly above the data line.

Preferably, the gate line connection wire is connected to a gate line through a first through hole provided above the gate line.

Preferably, the thin film transistor comprises a gate, an active layer, a source and a drain, a first insulation layer is provided on the gate line and the gate, the active layer is provided on the first insulation layer, a second insulation layer is provided on the active layer, the gate line connection wire is provided on the second insulation layer, the first through hole is provided in the first insulation layer and the second insulation layer, the gate line connection wire is connected to the gate line through the first through hole, a third insulation layer is provided on the gate line connection wire, the data line, the source and the drain are provided on the third insulation layer, the source is connected to the active layer through a second through hole provided in the second insulation layer and the third insulation layer, and the drain is connected to the active layer through a third through hole provided in the second insulation layer and the third insulation layer.

Preferably, the gate line connection wire comprises a protrusion portion, which is located outside a straight section of the gate line connection wire and connected with the straight section, the protrusion portion is connected to the gate line through the first through hole.

Preferably, the display substrate further comprises a connection pattern, which connects the gate line connection wire with the gate line through a fifth through hole provided above the gate line connection wire and a sixth through hole provided above the gate line, and the connection pattern and the pixel electrode are provided in the same layer.

Preferably, the thin film transistor comprises a gate, an active layer, a source and a drain, a first insulation layer is provided on the gate line and the gate, the active layer is provided on the first insulation layer, a second insulation layer is provided on the active layer, the gate line connection wire is provided on the second insulation layer, a third insulation layer is provided on the gate line connection wire, the data line, the source and the drain are provided on the third insulation layer, the source is connected to the active layer through a second through hole provided in the second insulation layer and the third insulation layer, the drain is connected to the active layer through a third through hole provided in the second insulation layer and the third insulation layer, a passivation layer is provided on the data line, the source and the drain, the pixel electrode and the connection pattern are provided on the passivation layer, the passivation layer is provided with a fourth through hole, the pixel electrode is connected to the drain through the fourth through hole, the fifth through hole is provided in the third insulation layer and the passivation layer, and the sixth through hole is provided in the first insulation layer, the second insulation layer, the third insulation layer and the passivation layer, the connection pattern connects the gate line connection wire with the gate line through the fifth through hole and the sixth through hole.

Preferably, the gate line connection wire comprises a protrusion portion, which is located outside a straight section of the gate line connection wire and connected with the straight section, the connection pattern connects the protrusion portion to the gate line through the fifth through hole and the sixth through hole.

Preferably, the gate line connection wire is located directly below the data line.

Preferably, the gate line connection wire is located directly above the data line.

To achieve the above object, the present invention provides a display device, comprising the above display substrate and an opposite substrate which are arranged oppositely.

To achieve the above object, the present invention provides a manufacturing method of a display substrate, comprising:

forming gate lines, gate line connection wires, data lines, a gate driving circuit and a source driving circuit on a base substrate, wherein the gate lines and the data lines define pixel units, the pixel unit comprises a thin film transistor and a pixel electrode connected with the thin film transistor, and the data lines are connected to the source driving circuit, the gate lines are connected to the gate driving circuit through the gate line connection wires, and both the gate driving circuit and the source driving circuit are located at edge positions on the base substrate in an extending direction of the data lines, and the gate driving circuit is located on the opposite side to the source driving circuit.

The present invention has the following beneficial effects.

In the technical solutions of the display substrate and the manufacturing method thereof, and the display device provided in the present invention, the gate line is connected to the gate driving circuit through the gate line connection wire, the gate driving circuit being located at the edge position on the base substrate in the extending direction of the data lines, and being opposite to the source driving circuit. The gate driving circuit does not need to be arranged at the edge position in the extending direction of the gate lines, reducing widths of the bezels in the extending direction of the gate lines, thus enabling the display device to have narrow bezels in the extending direction of the gate lines.

DETAILED DESCRIPTION OF THE EMBODIMENTS

To make those skilled in the art better understand the technical solutions of the present invention, the display substrate and the manufacturing method thereof, and the display device provided in the present invention will be further described in detail below in conjunction with the accompanying drawings.

Figure 1:
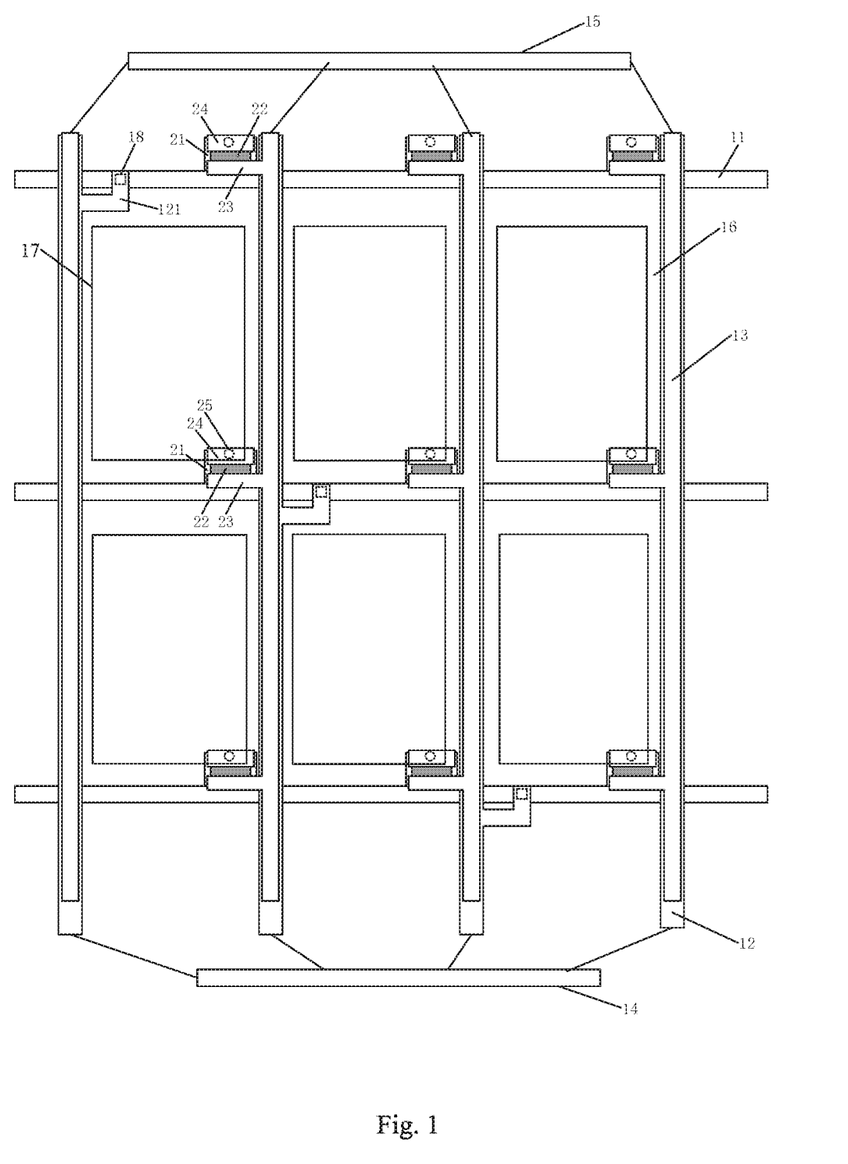
FIG. 1 is a structural diagram of a display substrate provided in a first embodiment of the present invention.
Figure 2:
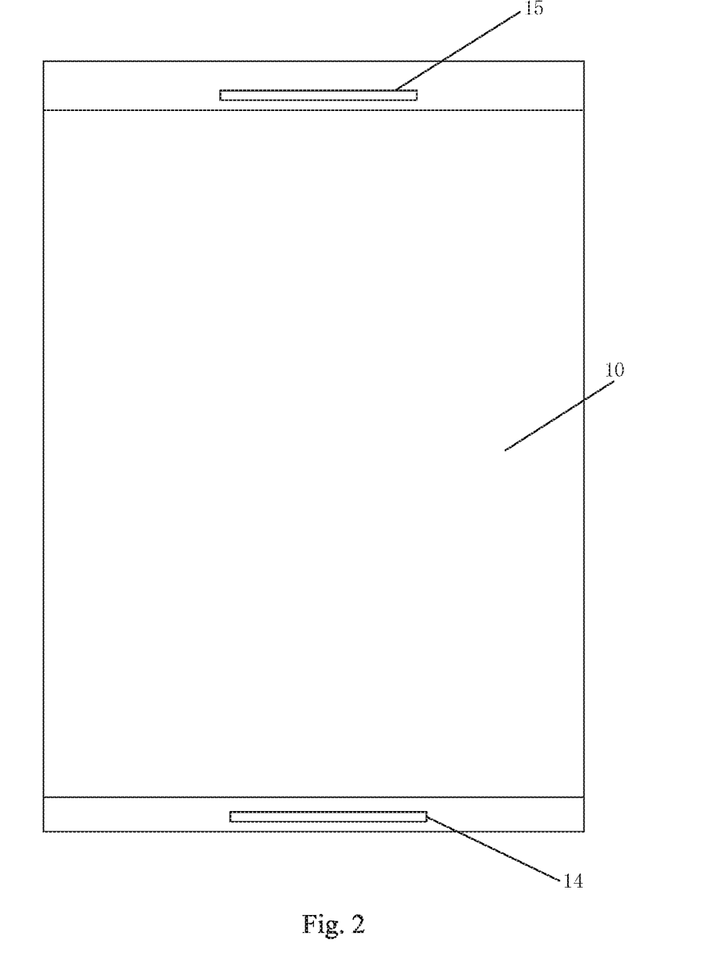
FIG. 2 is a positional diagram of a gate driving circuit and a source driving circuit in FIG. 1.

FIG. 1 is a structural diagram of a display substrate provided in a first embodiment of the present invention, and FIG. 2 is a positional diagram of a gate driving circuit and a source driving circuit in FIG. 1. As shown in FIG. 1, the display substrate comprises: a base substrate; and gate lines 11, gate line connection wires 12, data lines 13, a gate driving circuit 14 and a source driving circuit 15 on the base substrate, wherein the gate lines 11 and the data lines 13 define pixel units 16, the pixel unit 16 comprises a thin film transistor and a pixel electrode 17 connected with the thin film transistor. The data lines 13 are connected to the source driving circuit 15, the gate lines 11 are connected to the gate driving circuit 14 through the gate line connection wires 12. As shown in FIG. 2, both the gate driving circuit 14 and the source driving circuit 15 are located at edge positions on the base substrate 10 in an extending direction of the data lines, and the gate driving circuit 14 is located on the opposite side to the source driving circuit 15. For example, the source driving circuit 15 is located at an upper edge position of the base substrate 10, the gate driving circuit 14 is located at a bottom edge position of the base substrate 10 opposite to the source driving circuit 15. The gate driving circuit 14 is configured to output gate control signals to the gate lines 11, and the source driving circuit 15 is configured to output data signals to the data lines 13. The base substrate 10 is not shown in FIG. 1.

In this embodiment, a plurality of gate lines 11 are arranged horizontally, a plurality of data lines 13 are arranged vertically, and the plurality of gate lines 11 and the plurality of data lines 13 define pixel units 16.

The gate line connection wire 12 is at least partially overlapped with the data line 13. In this embodiment, a straight section of the gate line connection wire 12 is overlapped with the data line 13, the gate line connection wire 12 is arranged in parallel with the data line 13, and the gate line connection wire 12 is located directly below the data line 13. In practical applications, optionally, the gate line connection wire may be located directly above the data line, this case is not shown in detail.

In this embodiment, the gate line connection wire 12 is connected to a gate line 11 through a first through hole 18 provided above the gate line 11. Specifically, the gate line connection wire 12 is partially filled into the first through hole 18 so as to connect with the gate line 11, and thus realize the connection of the gate line connection wire 12 with the gate line 11.

The thin film transistor comprises a gate 21, an active layer 22, a source 23 and a drain 24. A first insulation layer is provided on the gate line 11 and the gate 21, the active layer 22 is provided on the first insulation layer, a second insulation layer is provided on the active layer 22, the gate line connection wire 12 is provided on the second insulation layer, the gate line connection wire 12 is connected to the gate line 11 through the first through hole 18 provided in the first insulation layer and the second insulation layer, a third insulation layer is provided on the gate line connection wire 12, the data line 13, the source 23 and the drain 24 are provided on the third insulation layer, the source 23 is connected to the active layer 22 through a second through hole provided in the second insulation layer and the third insulation layer, and the drain 24 is connected to the active layer 22 through a third through hole provided in the second insulation layer and the third insulation layer. Specifically, the first through hole 18 is provided in the first insulation layer and the second insulation layer above the gate line 11, the gate line connection wire 12 is partially filled into the first through hole 18 so as to connect with the gate line 11, and thus realize the connection of the gate line connection wire 12 with the gate line 11. The second through hole is provided in the second insulation layer and the third insulation layer above the active layer 22, the drain 23 is partially filled in the second through hole so as to connect with the active layer 22, and thus realize the connection of the source 23 with the active layer 22. The third through hole is provided in the second insulation layer and the third insulation layer above the active layer 22, the drain 24 is partially filled in the third through hole so as to connect with the active layer 22, and thus realize the connection of the drain 24 with the active layer 22. A passivation layer is provided on the data line 13, the source 23 and the drain 24, the pixel electrode 17 is provided on the passivation layer, the pixel electrode 17 is connected to the drain 24 through a fourth through hole 25 provided in the passivation layer. Specifically, the fourth through hole is provided in the passivation layer above the drain 24, the pixel electrode 17 is partially filled in the fourth through hole 25 so as to connect with the drain 24, and thus realize the connection of the pixel electrode 17 with the drain 24. The first insulation layer, the second insulation layer, the third insulation layer, the passivation layer, the second through hole and the third through hole are not shown in FIG. 1.

In this embodiment, the gate line connection wire 12 comprises a protrusion portion 121, which is located outside a straight section of the gate line connection wire 12 and connected with the straight section, the protrusion portion 121 is connected to the gate line 11 through the first through hole 18. Specifically, the protrusion portion 121 is partially filled in the first through hole 18 so as to connect with the gate line 11. Preferably, the protrusion portion 121 is L-shaped.

In the display substrate provided in this embodiment, the gate line is connected to the gate driving circuit through the gate line connection wire, the gate driving circuit is located at the edge position on the base substrate in the extending direction of the data lines (a vertical direction in FIG. 1), and the gate driving circuit is located on the opposite side to the source driving circuit, thus the gate driving circuit does not need to be arranged at the edge position in the extending direction of the gate lines (a horizontal direction in FIG. 1), reducing widths of the bezels in the extending direction of the gate lines, thus enabling the display device to have narrow bezel in the extending direction of the gate lines, and thereby improving display effect of the display device. Even the display device may have no bezel in the extending direction of the gate lines, and thus display effect of the display device can be further improved. In this embodiment, the gate line connection wire is connected to the gate line through the first through hole provided above the gate line, so that reliability of the connection is increased.

A second embodiment of the present invention provides a display substrate, which is different from the above first embodiment in that: this display substrate further comprises a connection pattern, which connects the gate line connection wire with the gate line through a fifth through hole provided above the gate line connection wire and a sixth through hole above the gate line, and the connection pattern and the pixel electrode are provided in the same layer.

The thin film transistor comprises a gate, an active layer, a source and a drain, a first insulation layer is provided on the gate line and the gate, the active layer is provided on the first insulation layer, a second insulation layer is provided on the active layer, the gate line connection wire is provided on the second insulation layer, a third insulation layer is provided on the gate line connection wire, the data line, the source and the drain are provided on the third insulation layer, the source is connected to the active layer through a second through hole provided in the second insulation layer and the third insulation layer, the drain is connected to the active layer through a third through hole provided in the second insulation layer and the third insulation layer. A passivation layer is provided on the data line, the source and the drain, the pixel electrode is connected to the drain through a fourth through hole provided in the passivation layer. The pixel electrode and the connection pattern are provided on the passivation layer, the passivation layer is provided with the fourth through hole, the pixel electrode is connected to the drain through the fourth through hole. The fifth through hole is provided in the third insulation layer and the passivation layer, and the sixth through hole is provided in the first insulation layer, the second insulation layer, the third insulation layer and the passivation layer, the connection pattern connects the gate line connection wire with the gate line through the fifth through hole and the sixth through hole. Specifically, the fifth through hole is provided in the third insulation layer and the passivation layer above the gate line connection wire, and the sixth through hole is provided in the first insulation layer, the second insulation layer, the third insulation layer and the passivation layer above the gate line, the connection pattern is partially filled in the fifth through hole so as to connect with the gate line connection wire, and the connection pattern is partially filled in the sixth through hole so as to connect with the gate line, thus the gate line connection wire is connected to the gate line. In this embodiment, the connection pattern and the pixel electrode are provided in the same layer, for example, both materials of the pixel electrode and the connection pattern are ITO. In this embodiment, the gate line connection wire may comprise a protrusion portion, which is located outside a straight section of the gate line connection wire and connected with the straight section, the connection pattern may connect the protrusion portion with the gate line through the fifth through hole and the sixth through hole. The fifth through hole may be provided in the third insulation layer and the passivation layer above the protrusion portion, preferably, this protrusion portion may be of a square.

In this embodiment, descriptions of the remained structures may refer to the above first embodiment, and will not described repeatedly. In addition, the solution of this embodiment will not be shown by drawings.

In the display substrate provided in this embodiment, the gate line is connected to the gate driving circuit through the gate line connection wire, the gate driving circuit is located at the edge position on the base substrate in the extending direction of the data lines, and the gate driving circuit is located on the opposite side to the source driving circuit, thus the gate driving circuit does not needed to be arranged at the edge position in the extending direction of the gate lines, reducing widths of the bezels in the extending direction of the gate lines, thus enabling the display device to have narrow bezel in the extending direction of the gate lines, and thereby improving display effect of the display device. Even the display device may have no bezel in the extending direction of the gate lines, and thus display effect of the display device can be further improved. In this embodiment, the connection pattern and the pixel electrode are provided in the same layer, the connection pattern connects the gate line connection wire with the gate line through the fifth through hole provided above the gate line connection wire and the sixth through hole provided above the gate line, the fifth through hole and the sixth through hole may be formed concurrently with the fourth through hole, so that the manufacturing process is simplified.

Figure 3:
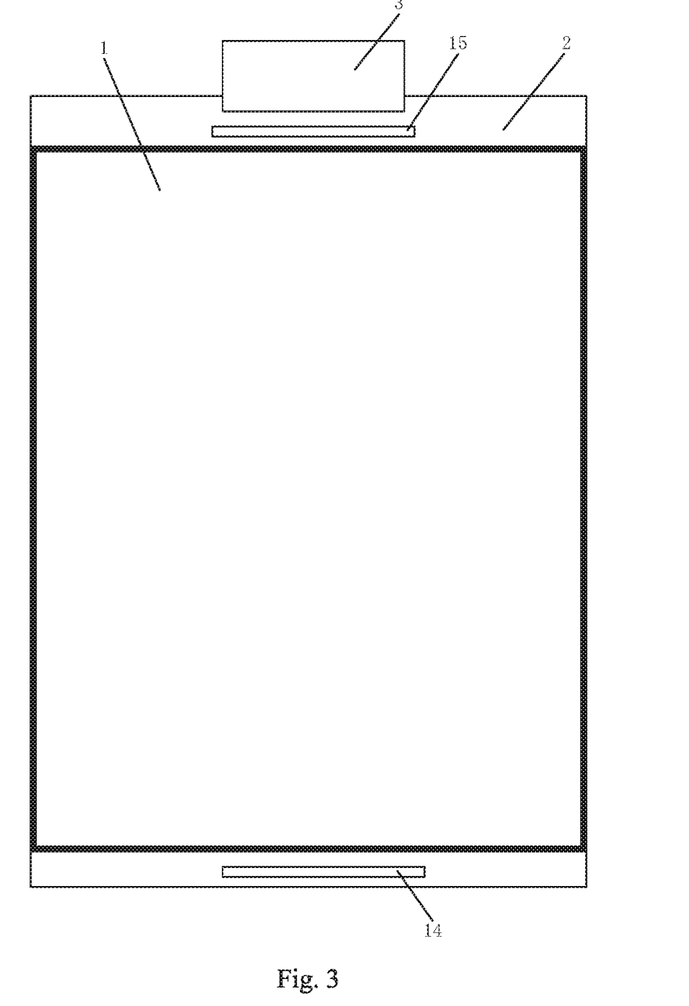
FIG. 3 is a structural diagram of a display device provided in a third embodiment of the present invention.

FIG. 3 is a structural diagram of a display device provided in a third embodiment of the present invention, as shown in FIG. 3, this display device comprises an opposite substrate 1 and a display substrate 2 which are arranged oppositely.

Preferably, the display substrate 2 may be an array substrate, the opposite substrate 1 may be a color filter substrate, and the opposite substrate 1 and the display substrate 2 are provided with liquid crystal therebetween.

In this embodiment, the display substrate 2 comprises a base substrate and a gate driving circuit 14 and a source driving circuit 15 provided on the base substrate, both the gate driving circuit 14 and the source driving circuit 15 are located at edge positions on the base substrate in an extending direction of the data lines, and the gate driving circuit 14 is located on the opposite side to the source driving circuit 15, for example, the source driving circuit 15 is located at an upper edge position of the base substrate 10, the gate driving circuit 14 is located at a bottom edge position of the base substrate 10 opposite to the source driving circuit 15.

In this embodiment, the display substrate 2 may be a display substrate in the above first embodiment or the second embodiment, descriptions of the display substrate 2 may refer to the above first embodiment or the second embodiment, and will not be described repeatedly herein.

Furthermore, the display device further comprises a driving circuit 3, which is connected to the gate driving circuit 14 and the source driving circuit 15 respectively, and configured to provide a gate control signal to the gate driving circuit 14 and provide a data signal to the source driving circuit 15.

In the display substrate provided in this embodiment, the gate line is connected to the gate driving circuit through the gate line connection wire, the gate driving circuit is located at the edge position on the base substrate in the extending direction of the data lines, and the gate driving circuit is located on the opposite side to the source driving circuit, thus the gate driving circuit does not needed to be arranged at the edge position in the extending direction of the gate lines, reducing widths of the bezels in the extending direction of the gate lines, thus enabling the display device to have narrow bezel in the extending direction of the gate lines, and thereby improving display effect of the display device. Even the display device may have no bezel in the extending direction of the gate lines, and thus display effect of the display device can be further improved.

A fourth embodiment of the present invention provides a manufacturing method of a display substrate, comprising:

forming gate lines, gate line connection wires, data lines, a gate driving circuit and a source driving circuit on a base substrate, wherein the gate lines and the data lines define pixel units, the pixel unit comprises a thin film transistor and a pixel electrode connected with the thin film transistor, and the data lines are connected to the source driving circuit, the gate lines are connected to the gate driving circuit through the gate line connection wires, and both the gate driving circuit and the source driving circuit are located at edge positions on the base substrate in an extending direction of the data lines, and the gate driving circuit is located on the opposite side to the source driving circuit.

In the embodiment, the thin film transistor comprises a gate, an active layer, a source and a drain, the step of forming a gate line, a gate line connection wire, a data line, a gate driving circuit and a source driving circuit includes steps 101 to 112.

Step 101, forming the gate line and the gate on the base substrate.

Figure 4A:
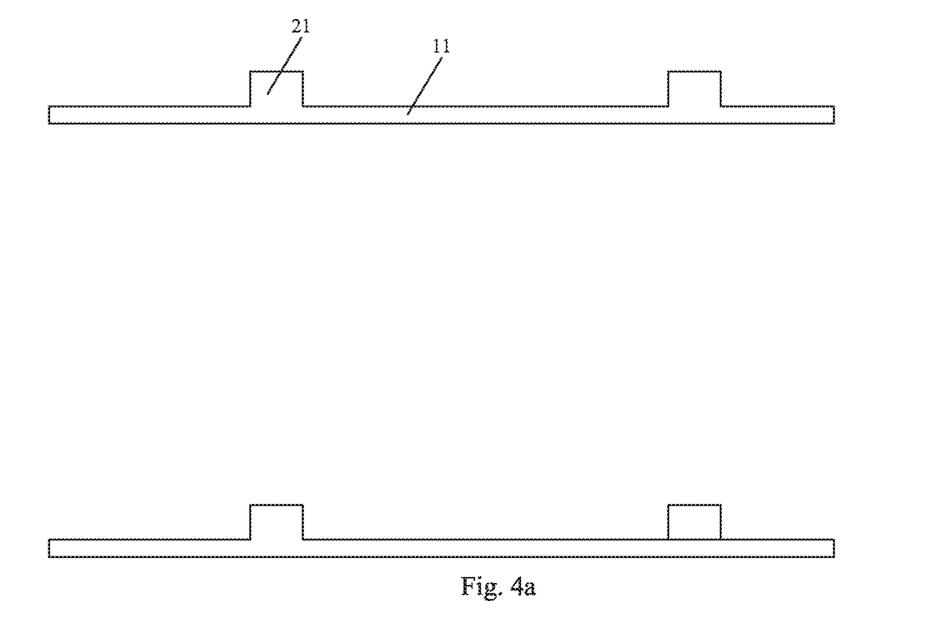
FIG. 4a is a diagram illustrating forming a gate line and a gate in a fourth embodiment.

FIG. 4a is a diagram illustrating forming a gate line and a gate in the fourth embodiment, as shown in FIG. 4, a gate line material layer is formed on the base substrate, and a patterning process is performed on the gate line material layer so as to form the gate line 11 and the gate 21.

Step 102, forming a first insulation layer on the gate line and the gate.

Step 103, forming the active layer on the first insulation layer.

Figure 4B:
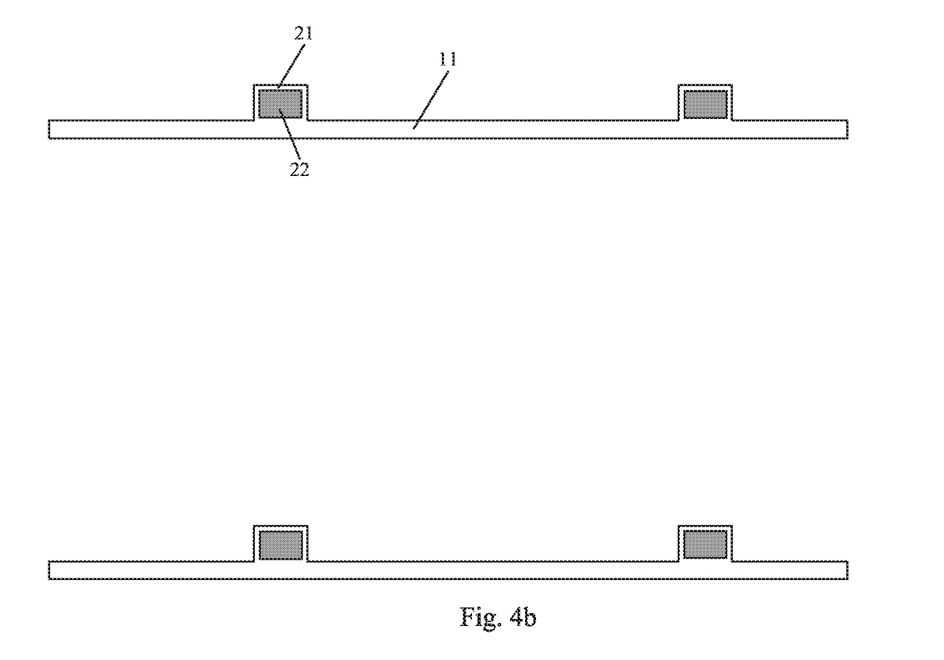
FIG. 4b is a diagram illustrating forming an active layer in the fourth embodiment.

FIG. 4b is a diagram illustrating forming an active layer in the fourth embodiment, as shown in FIG. 4b, a material layer for the active layer is formed on the first insulation layer, and a patterning process is performed on the material layer for the active layer so as to form the active layer 22.

Step 104, forming the second insulation layer on the active layer.

Step 105, forming a first through hole in the first insulation layer and the second insulation layer above the gate line.

Figure 4C:
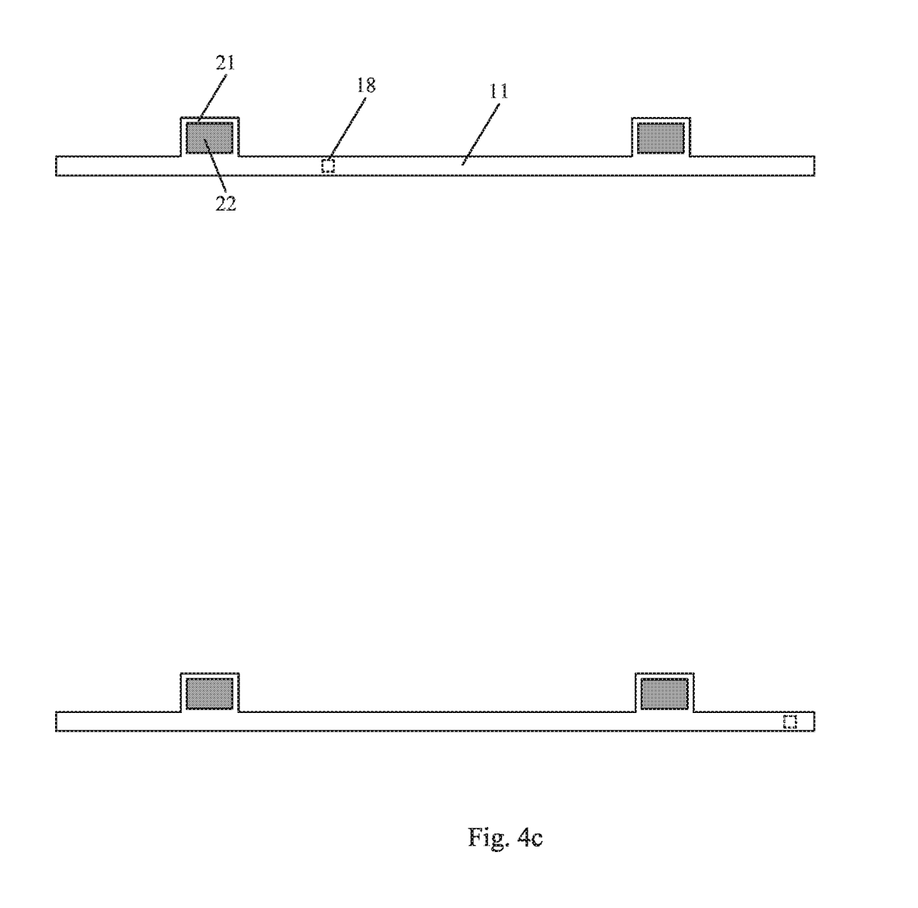
FIG. 4c is a diagram illustrating forming a first through hole in the fourth embodiment.

FIG. 4c is a diagram illustrating forming a first through hole in the fourth embodiment, as shown in FIG. 4c, the first through hole 18 is formed in the first insulation layer above the gate line 11 through a patterning process.

Step 106, forming the gate line connection wire on the second insulation layer, the gate line connection wire being connected to the gate line through the first through hole.

Figure 4D:
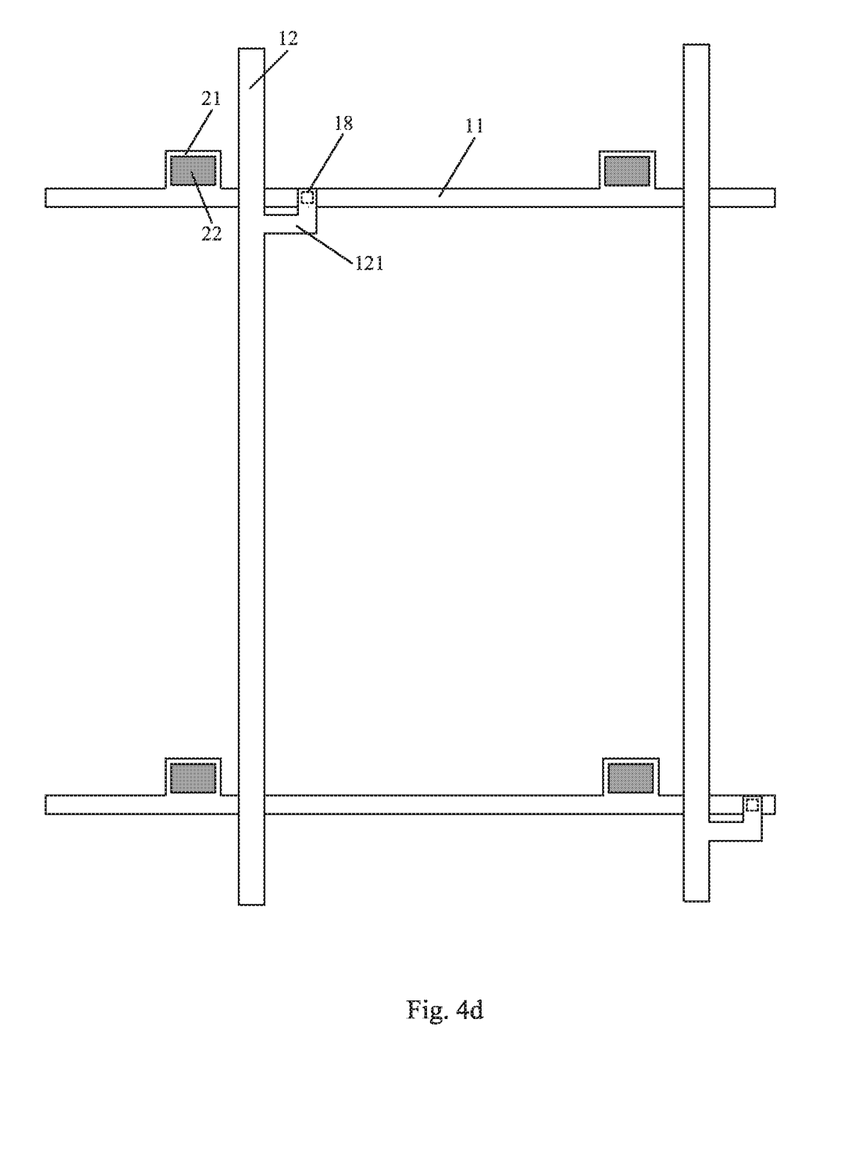
FIG. 4d is a diagram illustrating forming a gate line connection wire in the fourth embodiment.

FIG. 4d is a diagram illustrating forming a gate line connection wire in the fourth embodiment, as shown in FIG. 4d, a material layer for the gate line connection wire is formed on the second insulation layer, and a patterning process is performed on the material layer for the gate line connection wire so as to form the gate line connection wire 12. The gate line connection wire 12 is partially filled in the first through hole 18 so as to connect with the gate line 11. Specifically, the gate line connection wire 12 comprises a protrusion portion 121 which is partially filled in the first through hole 18 so as to connect with the gate line 11.

Step 107, forming a third insulation layer on the gate line connection wire.

Step 108, forming a second through hole in the second insulation layer and the third insulation layer above the source, and forming a third through hole in the second insulation layer and the third insulation layer above the drain.

Specifically, the second through hole and the third through hole may be formed in the second insulation layer and the third insulation layer by a patterning process.

Step 109, forming the data line, the source and the drain on the third insulation layer, the source being connected to the active layer through the second through hole, and the drain being connected to the active layer through the third through hole.

Figure 4E:
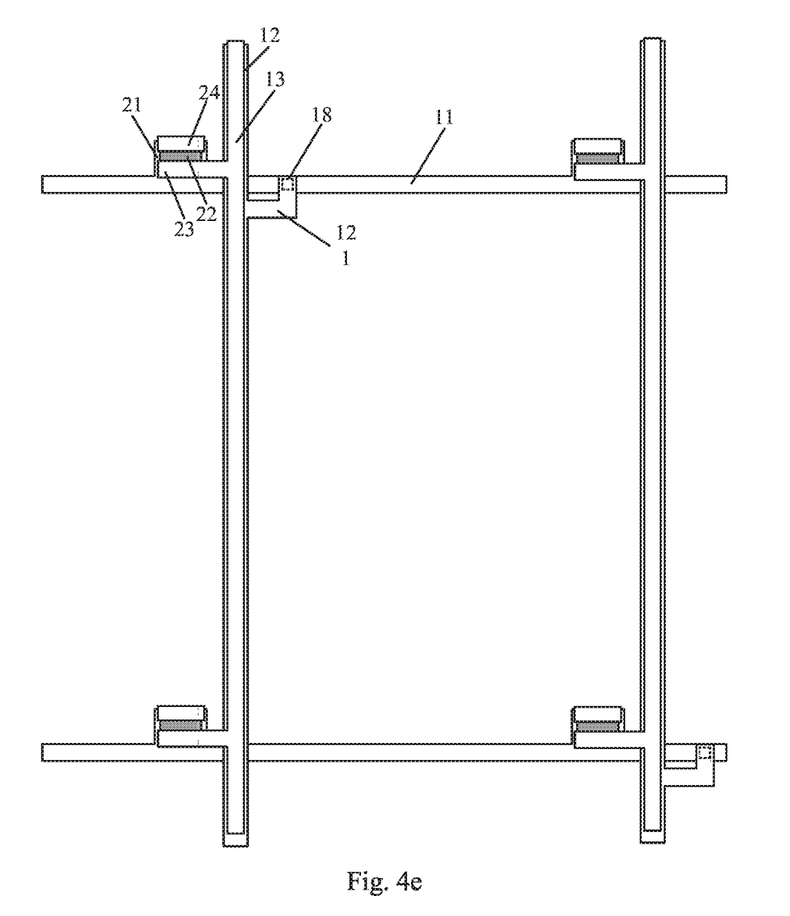
FIG. 4e is a diagram illustrating forming a data line, a source and a drain in the fourth embodiment.

FIG. 4e is a diagram illustrating forming the data line, the source and the drain in the fourth embodiment, as shown in FIG. 4e, a material layer for the data line is formed on the third insulation layer, and a patterning process is performed on the material layer for the data line so as to form the data line 13, the source 23 and the drain 24. The source 23 is partially filled in the second through hole so as to connect with the active layer 22, the drain 24 is partially filled in the third through hole so as to connect with the active layer 22.

Step 110, forming a passivation layer on the data line, the source and the drain.

Step 11, forming a fourth through hole in the passivation layer above the drain.

Figure 4F:
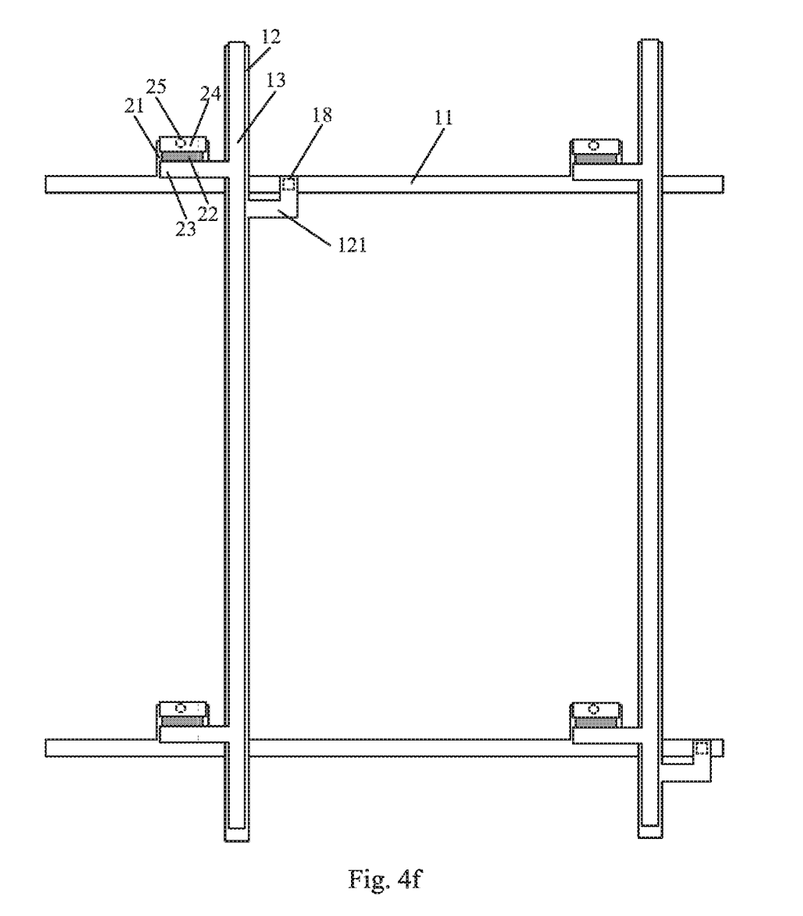
FIG. 4f is a diagram illustrating forming a fourth through hole in the fourth embodiment.

FIG. 4f is a diagram illustrating forming the fourth through hole in the fourth embodiment, as shown in FIG. 4f, the fourth through hole 25 is formed by performing a patterning process on the passivation layer.

Step 112, forming the pixel electrode on the passivation layer, the pixel electrode being connected to the drain through the fourth through hole.

Figure 4G:
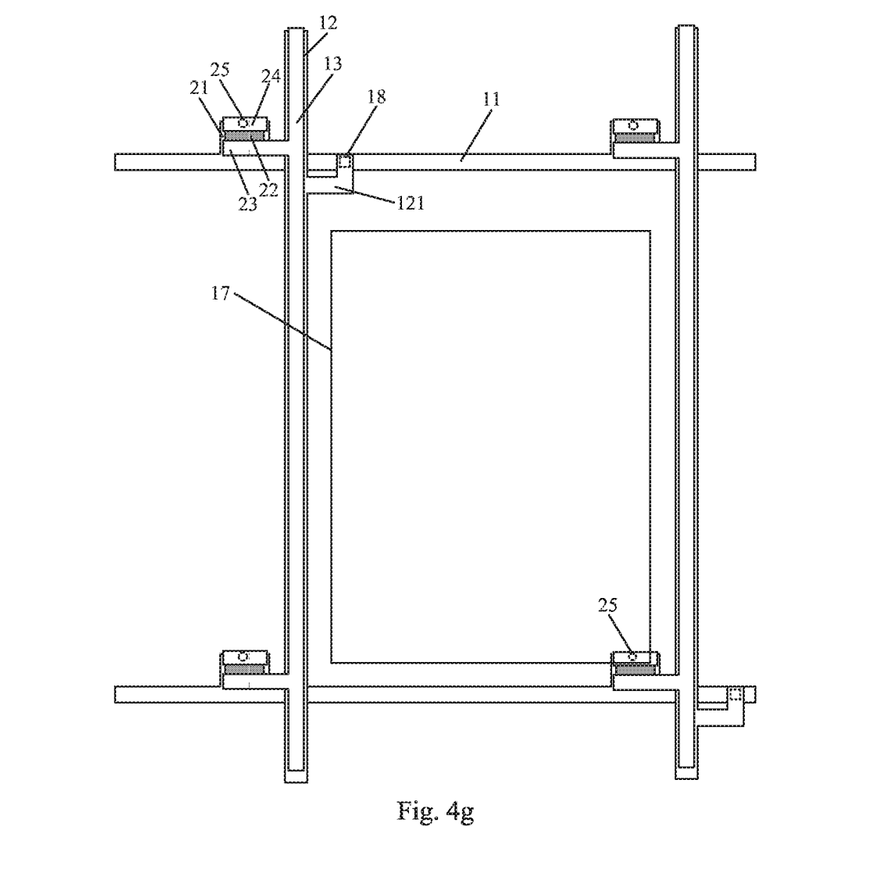
FIG. 4g is a diagram illustrating forming a pixel electrode in the fourth embodiment.

FIG. 4g is a diagram illustrating forming the pixel electrode in the fourth embodiment, as shown in FIG. 4g, a material layer for the pixel electrode is formed on the passivation layer, and a patterning process is performed on the material layer for the pixel electrode so as to form the pixel electrode 17. The pixel electrode 17 is partially filled in the fourth through hole 25 so as to connect with the drain 24.

In this embodiment, the patterning process may include processes such as coating photoresist, exposure, development, etching and stripping off the photoresist.

The manufacturing method of a display substrate provided in this embodiment may be used to manufacture the display substrate provided in the above first embodiment, descriptions of the display substrate may refer to the above first embodiment, and will not be described repeatedly herein.

In the present invention, structures of layers in the display substrate may be modified in positions and configurations as needed, and thus the manufacturing method of the display substrate is required to be modified accordingly, for example, the manufacturing method of the display substrate in the second embodiment may be modified according to that of the display substrate in the first embodiment, which will not be described in detail herein.

In the display substrate manufactured by the manufacturing method of the display substrate provided in this embodiment, the gate line is connected to the gate driving circuit through the gate line connection wire, the gate driving circuit is located at the edge position on the base substrate in the extending direction of the data lines, and the gate driving circuit is located on the opposite side to the source driving circuit, thus the gate driving circuit does not needed to be arranged at the edge position in the extending direction of the gate lines, reducing widths of the bezels in the extending direction of the gate lines, thus enabling the display device to have narrow bezel in the extending direction of the gate lines, and thereby improving display effect of the display device. Even the display device may have no bezel in the extending direction of the data lines, and thus display effect of the display device can be further improved.

It can be understood that the foregoing implementations are merely exemplary implementations used for describing the principle of the present invention, but the present invention is not limited thereto. Those of ordinary skill in the art may make various variations and improvements without departing from the spirit and essence of the present invention, and these variations and improvements shall fall into the protection scope of the present invention.

The invention claimed is:

1. A display substrate, comprising: a base substrate, and gate lines, data lines, a gate driving circuit and a source driving circuit on the base substrate, wherein the gate lines and the data lines define pixel units, each pixel unit comprises a thin film transistor and a pixel electrode connected with the thin film transistor, and the data lines are connected to the source driving circuit, the display substrate further comprising gate line connection wires on the base substrate,
  wherein the gate lines are connected to the gate driving circuit through gate line connection wires, and
  both the gate driving circuit and the source driving circuit are located at edge positions on the base substrate in an extending direction of the data lines, and the gate driving circuit is located on the opposite side to the source driving circuit, and wherein
  the gate line connection wires are connected with the gate lines through connection patterns in a one-to-one correspondence manner, and the connection patterns and the pixel electrode are provided in the same layer.

2. The display substrate of claim 1, wherein each of the gate line connection wires is at least partially overlapped with each of the data lines.

3. The display substrate of claim 2, wherein a straight section of each of the gate line connection wires is overlapped with each of the data lines.

4. The display substrate of claim 2, wherein the gate line connection wires are parallel to the data lines.

5. The display substrate of claim 1, wherein the gate line connection wires are located directly below the data lines; or, the gate line connection wires are located directly above the data lines.

6. The display substrate of claim 2, wherein the gate line connection wires are located directly below the data lines; or, the gate line connection wires are located directly above the data lines.

7. The display substrate of claim 3, wherein the gate line connection wires are located directly below the data lines; or, the gate line connection wires are located directly above the data lines.

8. The display substrate of claim 4, wherein the gate line connection wires are located directly below the data lines; or, the gate line connection wires are located directly above the data lines.

9. The display substrate of claim 1, wherein each of the gate line connection wires comprises a protrusion portion, which is located outside a straight section of a corresponding gate line connection wire and connected with the straight section, and the protrusion portion is connected to the corresponding gate line through a first through hole.

10. The display substrate of claim 1, wherein the connection patterns connect the gate line connection wires with the gate lines through through holes provided above each of the gate line connection wires and through holes provided above each of the gate lines.

11. The display substrate of claim 10, wherein, in each of the pixel units, the thin film transistor comprises a gate, an active layer, a source and a drain, a first insulation layer is provided on both the gate and one gate line of the gate lines, said one gate line of the gate lines intersects with one data line of the data lines to define a pixel unit comprising the thin film transistor, the active layer is provided on the first insulation layer, a second insulation layer is provided on the active layer, a gate line connection wire of the gate line connection wires corresponding to the gate line is provided on the second insulation layer, a third insulation layer is provided on the gate line connection wire and on the one data line of the data lines that defines the pixel unit, the source and the drain are provided on the third insulation layer, the source is connected to the active layer through a second through hole provided in the second insulation layer and the third insulation layer, the drain is connected to the active layer through a third through hole provided in the second insulation layer and the third insulation layer, a passivation layer is provided on the data line, the source and the drain, the pixel electrode and the connection pattern is provided on the passivation layer, the passivation layer is provided with a fourth through hole, the pixel electrode is connected to the drain through the fourth through hole, the fifth through hole is provided in the third insulation layer and the passivation layer, and the sixth through hole is provided in the first insulation layer, the second insulation layer, the third insulation layer and the passivation layer.

12. The display substrate of claim 10, wherein the gate line connection wires each comprises a protrusion portion, which is located outside a straight section of the gate line connection wire and connected with the straight section, the connection patterns connect the protrusion portions to each of the gate lines corresponding to the gate line connection wires through the through holes provided above the gate line connection wires and the through holes provided above the gate lines.

13. A display device comprising a display substrate and an opposite substrate which are arranged oppositely, wherein the display substrate is the display substrate of claim 1.

14. A display device comprising a display substrate and an opposite substrate which are arranged oppositely, wherein the display substrate is the display substrate of claim 2.

15. A display device comprising a display substrate and an opposite substrate which are arranged oppositely, wherein the display substrate is the display substrate of claim 3.

16. A display device comprising a display substrate and an opposite substrate which are arranged oppositely, wherein the display substrate is the display substrate of claim 4.

17. A display device comprising a display substrate and an opposite substrate which are arranged oppositely, wherein the display substrate is the display substrate of claim 5.

18. A manufacturing method of a display substrate, comprising:
   forming gate lines, gate line connection wires, data lines, a gate driving circuit and a source driving circuit on a base substrate, wherein the gate lines and the data lines define pixel units, each pixel unit comprises a thin film transistor and a pixel electrode connected with the thin film transistor, and the data lines are connected to the source driving circuit, the gate lines are connected to the gate driving circuit through the gate line connection wires, and both the gate driving circuit and the source driving circuit are located at edge positions on the base substrate in an extending direction of the data lines, and the gate driving circuit is located on the opposite side to the source driving circuit, and wherein
   the gate line connection wires are connected with the gate lines through connection patterns in a one-to-one correspondence manner, and the connection patterns and the pixel electrode are provided in the same layer.

* * * * *